(12) United States Patent
Sakai et al.

(10) Patent No.: US 6,183,552 B1
(45) Date of Patent: Feb. 6, 2001

(54) CRYSTAL GROWTH METHOD FOR THIN FILMS OF BISRCACUO OXIDES

(75) Inventors: Shigeki Sakai; Shinji Migita, both of Tsukuba (JP)

(73) Assignee: Agency Industrial Science & Technology, Ministry of International Trade & Industry, Tokyo (JP)

(*) Notice: Under 35 U.S.C. 154(b), the term of this patent shall be extended for 0 days.

(21) Appl. No.: 09/263,824

(22) Filed: Mar. 8, 1999

(30) Foreign Application Priority Data

Mar. 27, 1998 (JP) .................................................. 10-122630

(51) Int. Cl.[7] ............................. C30B 29/22; C30B 33/02
(52) U.S. Cl. .................................. 117/3; 117/89; 117/92; 117/103; 117/108; 117/944
(58) Field of Search .................................. 117/88, 89, 92, 117/103, 108, 944, 3; 505/121, 125, 126, 473–476, 501, 729, 731, 782

(56) References Cited

U.S. PATENT DOCUMENTS 5,296,455 * 3/1994 Harada et al. ........................ 505/476

FOREIGN PATENT DOCUMENTS

05009100 * 1/1993 (JP) .
10-158094 6/1998 (JP) .

* cited by examiner

Primary Examiner—Benjamin L. Utech
Assistant Examiner—Donald L. Champagne
(74) Attorney, Agent, or Firm—Oblon, Spivak, McClelland, Maier & Neustadt, P.C.

(57) ABSTRACT

A crystal growth method for thin films of oxides wherein a vapor-phase deposition method is used to grow crystals for $Bi_2Sr_2Ca_nCu_{n+1}O_{6+2n}$ oxide thin film 304, where n is an integer equal to 1 or greater, includes a first step of growing a $Bi_2Sr_2CuO_6$ oxide thin film 302 to an arbitrary number of molecular layers by setting a growth environment to conditions in which oxides of bismuth alone are not formed, but intended multi-element oxide is formed, and supplying the growth environment with an excess of bismuth compared with other elements, thereby preventing deficiency of bismuth and also evaporating excess bismuth from the thin film, a second step of causing a layer 303 containing calcium atoms and copper atoms each in the amount of n/2 of the number of strontium atoms contained in the $Bi_2Sr_2CuO_6$ oxide thin film to accumulate upon the $Bi_2Sr_2CuO_6$ oxide thin film, and a third step of, in a state in which environmental temperature is set higher than the environmental temperature in the first step, causing the $Bi_2Sr_2CuO_6$ oxide thin film 302 and the accumulated calcium atoms and copper 303 atoms to react to grow crystals for a thin film 304 of an oxide $Bi_2Sr_2Ca_nCu_{n+1}O_{6+2n}$, where n is an integer equal to 1 or greater.

15 Claims, 5 Drawing Sheets

CRYSTAL GROWTH METHOD FOR THIN FILMS OF BISRCACUO OXIDES

BACKGROUND OF THE INVENTION

1. Field of the Invention

This invention relates to a crystal growth method for thin films of oxides wherein vaporphase deposition is used to grow crystals for thin films of the oxides $Bi_2Sr_2Ca_nCu_{n+1}O_{6+2n}$, where n is an integer equal to 1 or greater.

2. Description of the Background

The oxides $Bi_2Sr_2Ca_nCu_{n+1}O_{6+2n}$, where n is an integer equal to 1 or greater can be produced by vapor-phase deposition methods, and those in which n is 1 to 4 are known as materials that exhibit superconductivity.

Methods of producing thin films of $Bi_2Sr_2Ca_nCu_{n+1}O_{6+2n}$ oxides that have been developed and utilized include sputtering, laser ablation, molecular beam epitaxy, chemical vapor deposition (CVD) and others. Note that in the following description, regarding $Bi_2Sr_2Ca_nCu_{n+1}O_{6+2n}$, n is always an integer equal to 1 or greater if not stated specifically.

When thin films of the oxides $Bi_2Sr_2Ca_nCu_{n+1}O_{6+2n}$ are produced according to the prior art, the fraction of the element bismuth that is incorporated into the thin-film crystals is small and sensitive to variations in the growth temperature. For this reason, the optimal growth environment is limited to small regions, and moreover, the bismuth in the thin film is often deficient compared to the ideal oxide composition.

This is a major problem in the crystal growth of thin films of the oxides $Bi_2Sr_2Ca_nCu_{n+1}O_{6+2n}$ which contain bismuth as a constituent element, becoming a major impediment to improving the quality of these thin films. Moreover, even if it were possible to find growth temperatures and oxidation gas conditions that minimize this problem, these would be limited to extremely narrow conditions and reproduction of thin films having the same level of quality would be difficult.

As a method of solving this problem, a crystal growth method for thin films of multi-element oxides containing bismuth as a constituent element is known, having been disclosed in the Specification of published examined Japanese patent application JP-A-10-158094, for example. This method is a crystal growth method for thin films of multi-element oxides containing bismuth as a constituent element using a vapor-phase deposition method, characterized in that it is:

a crystal growth method for thin films of multi-element oxides containing bismuth as a constituent element wherein the growth environment is set to conditions in which oxides of bismuth alone are not formed, but the intended multi-element oxide is formed, and an excess of bismuth compared to the other elements is supplied in said growth environment, thereby preventing the deficiency of bismuth and also evaporating excess bismuth from the thin film.

By means of this method, the crystal growth of thin films of the oxide $Bi_2Sr_2CuO_6$ with no excess or deficiency of bismuth can be performed.

However, the application of this method to the oxides $Bi_2Sr_2Ca_nCu_{n+1}O_{6+2n}$ is difficult.

Figure 8:
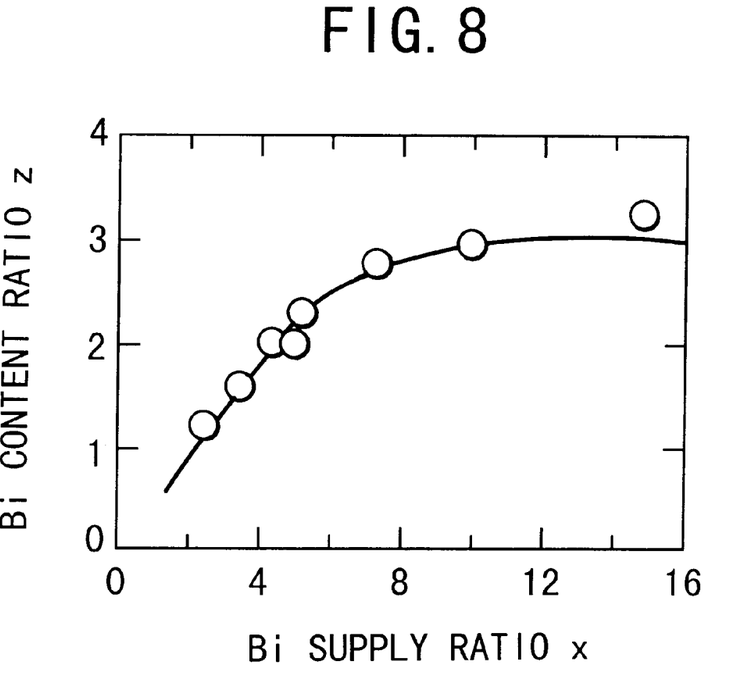
FIG. 8 is a graph illustrating the relationship between the ratio of bismuth supplied x and the bismuth content ratio z in the thin film formed when the conventional crystal growth method is utilized to grow crystals of a thin film of $Bi_2Sr_2CaCu_2O_8$ oxide.

FIG. 8 shows one example of the results of an attempt at the crystal growth of thin films the oxide $Bi_2Sr_2CaCu_2O_8$ by means of the aforementioned conventional crystal growth method. To wit, in the case of the oxide $Bi_2Sr_2CuO_6$, even if the amount of bismuth supplied is increased (to a supply ratio x), the bismuth content ratio z constantly maintains a value near the target value of 2, but in the case of the oxide $Bi_2Sr_2CaCu_2O_8$, as is clear from FIG. 8, the bismuth content ratio z does not remain at 2 but changes toward 3 together with the increase in the amount of bismuth supplied.

This is based on the fact that in a growth environment in which an excess of bismuth is supplied, a chemical change occurs according to the following chemical formula (1):

$$Bi+Bi_2Sr_2CaCu_2O_8+1.5O \rightarrow 1.5[Bi_2(Sr_{2/3}Ca_{1/3})_2CuO_6]+0.5CuO \quad (1)$$

This chemical formula (1) means that since $Bi_2Sr_2CaCu_2O_8$ and $Bi_2Sr_2CuO_6$ have similar crystal structures and the chemical properties of Sr and Ca are similar, a $Bi_2Sr_2CuO_6$ analog represented by $Bi_2(Sr_{2/3}Ca_{1/3})_2Cu_2O_6$ is generated by some of the strontium sites in the $Bi_2Sr_2CuO_6$ being occupied by calcium.

In this manner, if one attempts to grow $Bi_2Sr_2Ca_nCu_{n+1}O_{6+2n}$ oxides by means of the aforementioned conventional crystal growth method, there are problems in that the bismuth composition diverges from the target composition, leading to the generation of different phases or the precipitation of impurities, so the growth of high-quality thin films is difficult.

The present invention was proposed in light of the aforementioned problems, and its object is to provide a crystal growth method for thin films of oxides that is able to grow high-quality thin films of $Bi_2Sr_2Ca_nCu_{n+1}O_{6+2n}$ oxides and prevent excess or deficiency of bismuth, which is one of its constituent elements.

SUMMARY OF THE INVENTION

In order to achieve the aforementioned object, this invention provides a crystal growth method for thin films of oxides wherein a vapor-phase deposition method is used to grow crystals for $Bi_2Sr_2Ca_nCu_{n+1}O_{6+2n}$ oxide thin film, where n is an integer equal to 1 or greater, comprising a first step of growing a $Bi_2Sr_2CuO_6$ oxide thin film to an arbitrary number of molecular layers by setting a growth environment to conditions in which oxides of bismuth alone are not formed, but intended multi-element oxide is formed, and supplying said growth environment with an excess of bismuth compared with other elements, thereby preventing deficiency of bismuth and also evaporating excess bismuth from the thin film, a second step of causing a layer containing calcium atoms and copper atoms each in the amount of n/2 of the number of strontium atoms contained in said $Bi_2Sr_2CuO_6$ oxide thin film to accumulate upon said $Bi_2Sr_2CuO_6$ oxide thin film, and a third step of, in a state in which environmental temperature is set higher than the environmental temperature in the first step, causing said $Bi_2Sr_2CuO_6$ oxide thin film and the accumulated calcium atoms and copper atoms to react to grow crystals for a thin film of an oxide $Bi_2Sr_2Ca_nCu_{n+1}O_{6+2n}$, where n is an integer equal to 1 or greater.

The crystal growth method according to the present invention also includes the case wherein said first step, second step and third step are repeated to build up at least two or more layers of said thin film of the oxide $Bi_2Sr_2Ca_nCu_{n+1}O_{6+2n}$, where n is an integer equal to 1 or greater.

Moreover, the crystal growth method according to the present invention also includes the case wherein among said two or more layers of the thin film of the oxide $Bi_2Sr_2Ca_nCu_{n+1}O_{6+2n}$ built up, at least one of the layers has a different value of n than the other layers.

As described above, with this invention, upon a $Bi_2Sr_2CuO_6$ thin film is accumulated a layer containing calcium and copper atoms each in the amount of n/2 of the number of strontium atoms contained in this $Bi_2Sr_2CuO_6$, and these atoms are caused to react while preventing excess or deficiency of bismuth, and thus the generation of different phases or precipitation of impurities is suppressed, so it is possible to obtain a high-quality $Bi_2Sr_2Ca_nCu_{n+1}O_{6+2n}$ oxide thin film.

The other objects and other characteristics of the present invention will be made clear by the following detailed explanation based on the appended drawing.

DESCRIPTION OF THE PREFERRED EMBODIMENTS

Here follows a detailed description of the preferred embodiment of the present invention made with reference to the drawing.

Figure 1:
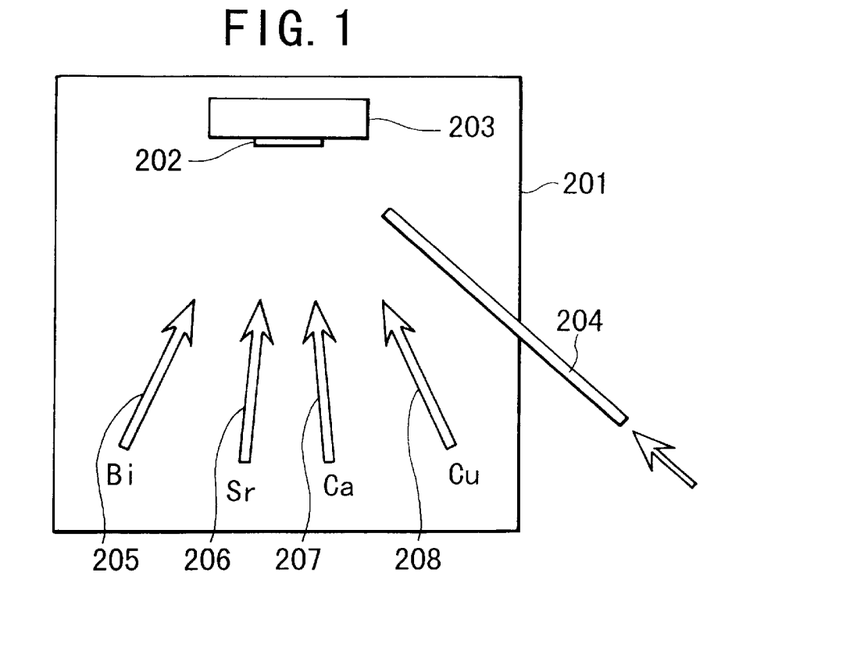
FIG. 1 is a schematic diagram of the apparatus used to grow the thin film of oxides according to the present invention.

FIG. 1 is a diagram that schematically shows the structure of the apparatus used to perform the growth of the thin film according to the present invention. In the figure, vacuum apparatus 201 is an apparatus for producing the thin film according to the present invention by means of vapor-phase deposition. A substrate 202 is disposed adjacent to a heater 203 near one edge of the interior of this vacuum apparatus 201 so that the temperature of the substrate 202 is controlled by the heater 203 to maintain the thin-film growth temperature (environmental temperature). Facing this substrate 202 is disposed a gas introduction means 204 along with supply means 205, 206, 207 and 208 for the various elements. Gas introduction means 204 is used to introduce oxidation gas into the interior of the vacuum apparatus 201, taking the form of a tube as shown in the figure. The oxidation gas referred to here refers to oxygen gas, ozone gas, atomic oxygen gas, $N_2O$ gas, $NO_2$ gas, ionized oxygen gas or other gas source that supplies oxygen to the crystals of the $Bi_2Sr_2Ca_nCu_{n+1}O_{6+2n}$ oxide. In addition, supply means 205 provides a supply of the element bismuth; supply means 206 provides a supply of the element strontium; supply means 207 provides a supply of the element calcium; while supply means 208 provides a supply of the element copper.

Here follows an explanation of the crystal growth method of the present invention.

Figure 2A:
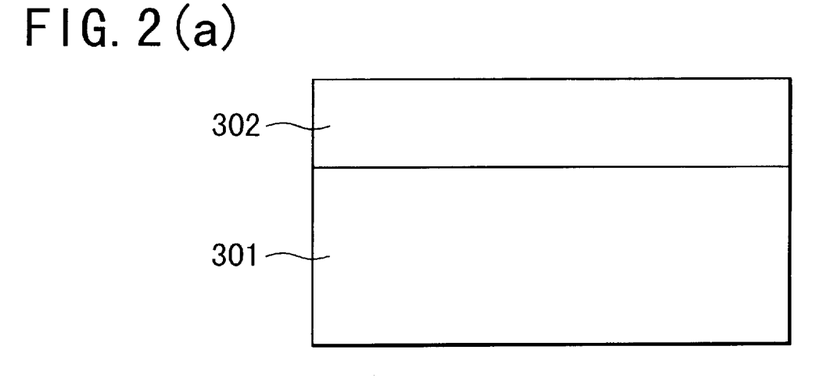
FIG. 2(a) is an explanatory diagram showing a cross section of the thin film formed in the first step of the growth method according to the present invention.
Figure 2B:
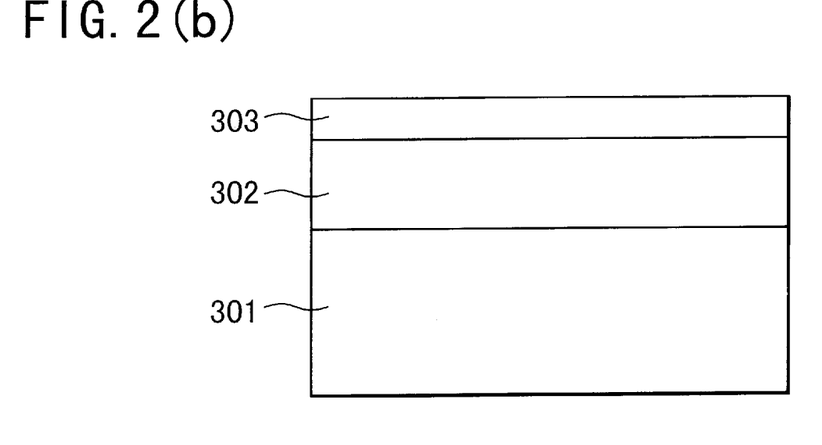
FIG. 2(b) is an explanatory diagram showing a cross section of the thin film formed in the second step of the growth method according to the present invention.
Figure 2C:
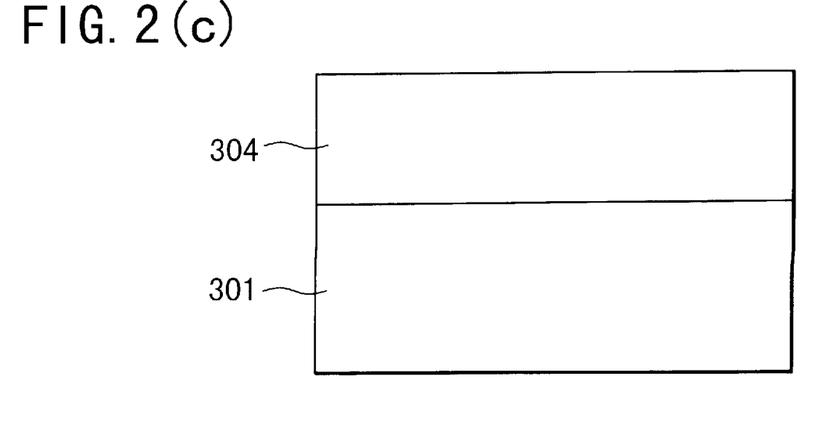
FIG. 2(c) is an explanatory diagram showing a cross section of the thin film formed in the third step of the growth method according to the present invention.

FIG. 2 is a diagram used to explain the crystal growth method for the thin film of $Bi_2Sr_2Ca_nCu_{n+1}O_{6+2n}$ oxide according to the present invention, where FIG. 2(a) shows a cross section of the thin film formed in the first step, FIG. 2(b) shows that in the second step and FIG. 2(c) shows that in the third step, respectively.

The thin film of $Bi_2Sr_2Ca_nCu_{n+1}O_{6+2n}$ oxide according to the present invention is formed by crystal growth upon the foundation 301 shown in FIGS. 2(a) through 2(c). The foundation 301 may be the substrate 202 itself shown in FIG. 1. In this case, the foundation 301 may be $SrTiO_3$, $NdGaO_3$, $LaAlO_3$ or the like, but it is not limited to these. In addition, the foundation 301 may also be formed by growing thin films upon the substrate 202 by means of vapor-phase deposition or the like. In particular, it may also be the result of the crystal growth of the thin film of $Bi_2Sr_2Ca_nCu_{n+1}O_{6+2n}$ oxide according to the present invention, so by repeating this method, it is possible to grow a thin film of $Bi_2Sr_2Ca_nCu_{n+1}O_{6+2n}$ oxide to the desired thickness, or it is also possible to build up layers of thin films each having a different integer n as desired according to design. If the foundation 301 has lattice constants close to those of the crystal lattice of the $Bi_2Sr_2Ca_nCu_{n+1}O_{6+2n}$ oxide, then this is particularly good for improving the quality of crystal growth, and moreover, the mutual diffusion of atoms with the $Bi_2Sr_2Ca_nCu_{n+1}O_{6+2n}$ oxide is reduced so the quality of the crystal growth is improved and thus this is preferable.

As the first step, upon this foundation 301 is grown a thin film according to the crystal growth method for thin films of multi-element oxides containing bismuth as a constituent element disclosed in published examined Japanese patent application JP-A-10-158094. To wit, the growth environment is set to conditions in which oxides of bismuth alone are not formed, but the intended multi-element oxide is formed, and an excess of bismuth compared to the other elements is supplied in said growth environment, thereby preventing the deficiency of bismuth and also evaporating excess bismuth from the thin film. Thereby, a thin film of the multi-element oxide $Bi_2Sr_2CuO_6$ 302 is grown. The appearance at the end of this first step is shown in FIG. 2(a).

In terms of the thin-film production device of FIG. 1, supply means 207 is not used in the first step and the supply of calcium is not performed.

Next, in the second step, upon the thin film of $Bi_2Sr_2CuO_6$ formed in the first step is accumulated a layer containing calcium atoms in the amount of n/2 of the number of strontium atoms contained in this $Bi_2Sr_2CuO_6$ thin film 302 and copper atoms in the similar amount of n/2, to form an atom accumulation layer 303. The appearance at the end of this second step is shown in FIG. 2(b). This atom accumulation layer 303 of calcium and copper may be formed by alternating layers of calcium and copper or it may be accumulated in a mixed state, and the degree of oxidation of the atom accumulation layer 303 is not a problem.

In terms of the thin-film production device of FIG. 1, in step 2, calcium and copper are supplied using supply means 207 and 208, while supply means 205 and 206 are not used so the supply of bismuth and strontium is not performed.

In the third step of FIG. 2(c), the $Bi_2Sr_2CuO_6$ thin film 302 and the calcium and copper of the atom accumulation layer 303 are caused to react to grow the intended $Bi_2Sr_2Ca_nCu_{n+1}O_{6+2n}$ oxide thin film 304. The chemical reaction in this third step is expressed by the following chemical formula (2):

$$Bi_2Sr_2CuO_6 + nCa + nCu + 2nO \rightarrow Bi_2Sr_2Ca_nCu_{n+1}O_{6+2n} \quad (2)$$

The environmental temperature (temperature of the substrate 202 or foundation 301) in the first, second and third steps need not be maintained at a constant value during the respective growth steps.

If we let the environmental temperature in the first and third steps be T1 and T3 respectively, then T3 is set higher than T1 in this embodiment.

In addition, the amount of the $Bi_2Sr_2CuO_6$ thin film 302 in the first step may be any suitable amount, as it may be formed thickly of 5 molecular layers, for example. In addition, it need not be an integral multiple of the number of molecular layers, as it may be 8.7 molecular layers, for example. Here, the thickness of one molecular layer is approximately 1.2 nm or one-half the c-axis length of the $Bi_2Sr_2CuO_6$ when converted to the thickness of a perfectly flat film.

In addition, if the amount of the $Bi_2Sr_2CuO_6$ thin film 302 formed in the first step is made to be 1 molecular layer, then only a small amount of reacting occurs in the third step so the time required for crystal growth can be reduced.

Here follows a more specific explanation of the afore-mentioned crystal growth method.

Figure 3:
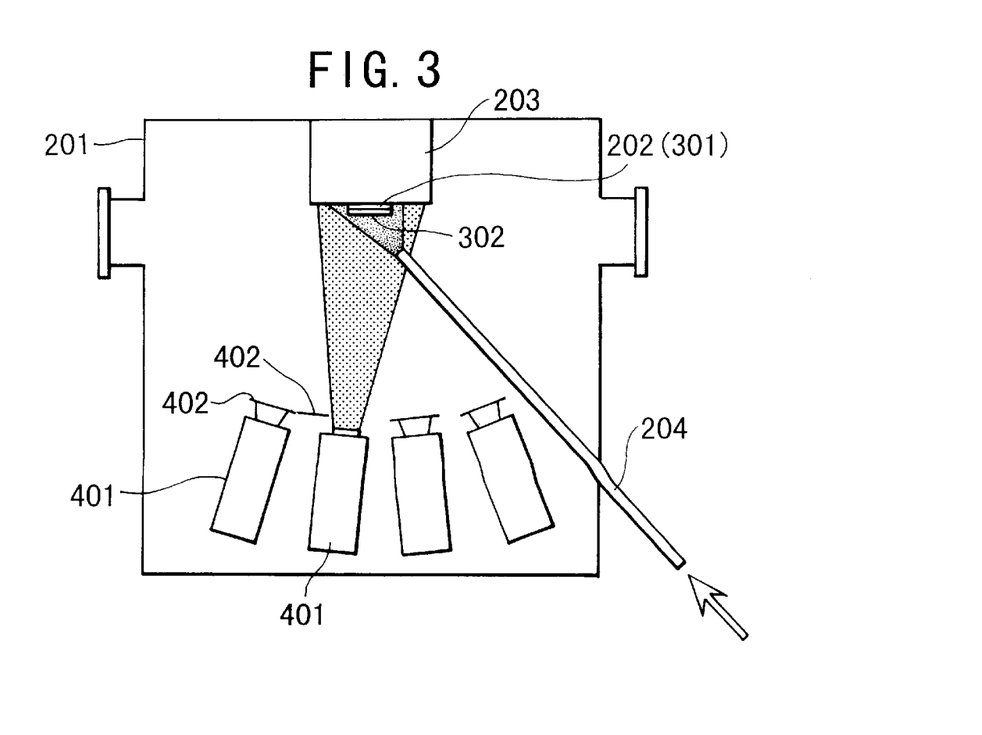
FIG. 3 is a schematic explanatory diagram showing the thin film of oxides formed by the molecular-beam epitaxy apparatus according to the present invention.

FIG. 3 is a schematic diagram showing the apparatus configuration in the event that the apparatus used for the vapor-phase deposition of the $Bi_2Sr_2Ca_nCu_{n+1}O_{6+2n}$ oxide according to the present invention is a molecular-beam epitaxy apparatus. In the figure, the constituent components that are identical to those in FIG. 1 are given the same numbers and their explanation is omitted.

In the molecular-beam epitaxy method, an effusion cell 401 that generates an atomic flux is used, so that the bismuth and other constituent elements are each supplied independently. A shutter 402 is provided on the outlet of this effusion cell 401. Control of the atomic flux is achieved by adjusting the opening of this shutter 402 and the amount of time that it is open, and by adjusting the temperature of the effusion cell 401.

In addition, an electron gun-heated cell can be used instead of this effusion cell 401 for elements with high melting points. In this case, control of the atomic flux is achieved by adjusting the output of the electron gun or by adjusting the opening of a shutter provided on its outlet and the amount of time that it is open. Note that any means of supplying an atomic flux may be used as long as it is suited to the molecular-beam epitaxy method.

Here follows a description of the results of an experiment in which the molecular-beam epitaxy apparatus of FIG. 3 is used to produce a thin film of $Bi_2Sr_2CaCu_2O_8$ oxide.

First, as the first step, upon substrate 202 as the foundation 301 is grown a $Bi_2Sr_2CuO_6$ oxide thin film 302 is grown by means of the aforementioned crystal growth method for thin films of multi-element oxides containing bismuth as a constituent element.

The environmental temperature T1 at this time was 720° C. The quantity of the $Bi_2Sr_2CuO_6$ oxide thin film 302 grown is taken to be a 1-molecule thick layer. $SrTiO_3$ is used as the substrate 202.

As the second step, as shown in FIG. 2(b), a layer containing calcium atoms in the amount of ½ of the number of strontium atoms contained in the $Bi_2Sr_2CuO_6$ thin film 302 and copper atoms in the similar amount of ½ is accumulated to form an atom accumulation layer 303. The environmental temperature at this time is 720° C.

As the third step, as shown in FIG. 2(b), the $Bi_2Sr_2CuO_6$ thin film 302 and the calcium and copper atoms of the atom accumulation layer 303 are caused to react to grow a 1-molecule thick layer of the $Bi_2Sr_2CaCu_2O_8$ oxide thin film 304. The environmental temperature T3 at this time is 780° C.

Figure 4:
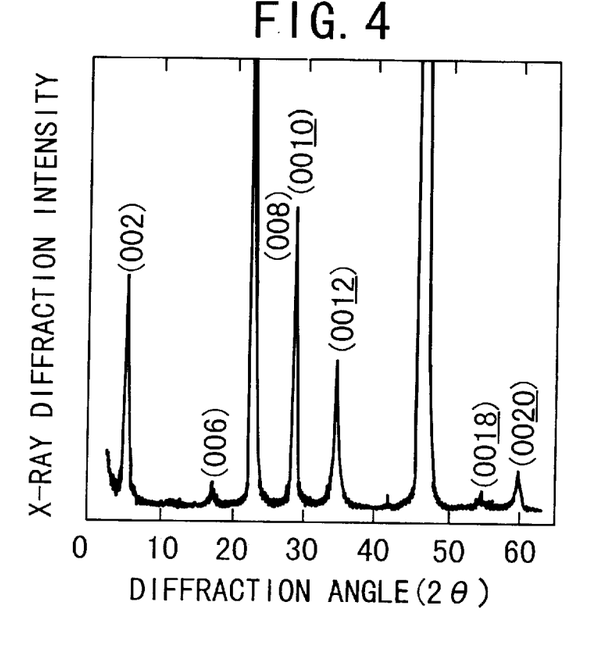
FIG. 4 is an x-ray diffraction diagram of a thin film of $Bi_2Sr_2CaCu_2O_8$ oxide consisting of 10 molecular layers.

The $Bi_2Sr_2CaCU_2O_8$ oxide thin film thus grown on the substrate 202 is used as the foundation to perform the process in the first through third steps above again to grow another 1-molecule thick layer of the $Bi_2Sr_2CaCu_2O_8$ oxide thin film. Thereby, a 2-molecule thick layer of the $Bi_2Sr_2CaCu_2O_8$ oxide thin film is grown upon the substrate 202. By repeating this process, a 10-molecule thick layer of the $Bi_2Sr_2CaCu_2O_8$ oxide thin film is grown upon the substrate 202. FIG. 4 is an x-ray diffraction diagram of the $Bi_2Sr_2CaCu_2O_8$ oxide thin film consisting of 10 molecular layers. FIG. 4 demonstrates that a $Bi_2Sr_2CaCu_2O_8$ thin film with only a single phase was produced.

Figure 5:
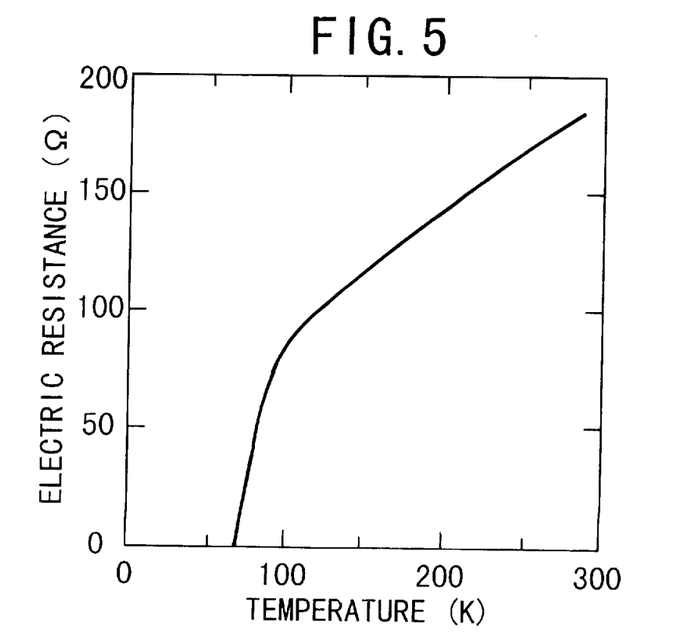
FIG. 5 is a graph that shows the electric resistance as a function of temperature for a thin film of $Bi_2Sr_2CaCu_2O_8$ oxide consisting of 6 molecular layers.

Next, we shall explain a second example in which the molecular-beam epitaxy apparatus of FIG. 3 is used to produce a thin film of $Bi_2Sr_2Ca_2Cu_3O_{10}$ oxide. In this second example, $SrTiO_3$ is used as the substrate 202. The environmental temperatures at the time of crystal growth are set so that the environmental temperature T1 at the time of the first step is 680° C., the environmental temperature at the time of the second stage is the same 680° C., and the environmental temperature T3 at the time of the third step is 780° C. A 6-molecule thick layer of the $Bi_2Sr_2CaCu_2O_8$ oxide thin film 304 was grown. FIG. 5 shows the electric resistance as a function of temperature for the $Bi_2Sr_2CaCu_2O_8$ oxide thin film consisting of 6 molecular layers thus obtained. One can see that the superconducting transition characteristic of the oxide $Bi_2Sr_2CaCu_2O_8$ appears at the absolute temperature of 70 K.

Figure 6:
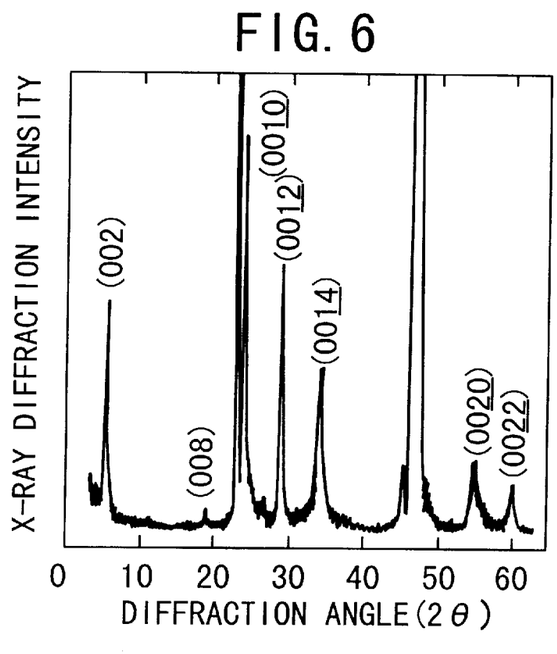
FIG. 6 is an x-ray diffraction diagram of a thin film of $Bi_2Sr_2Ca_2Cu_3O_{10}$ oxide consisting of 20 molecular layers.
Figure 7:
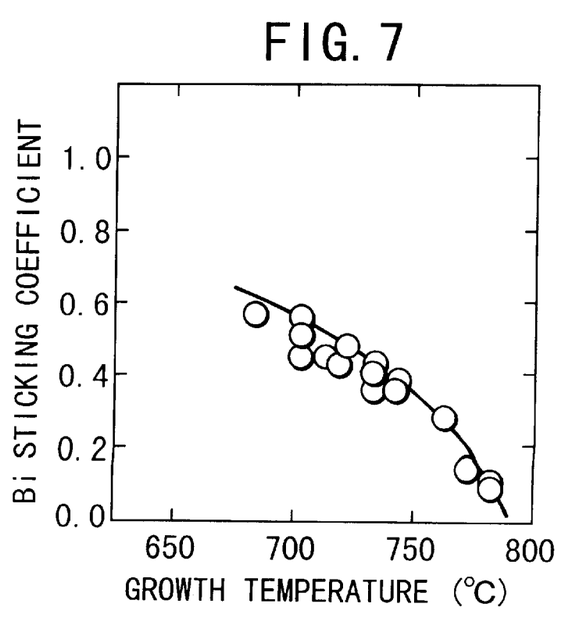
FIG. 7 is a graph illustrating the relationship between the growth temperature and the fraction of the element bismuth incorporated into the thin film.

Next, we shall explain a third example in which the molecular-beam epitaxy apparatus of FIG. 3 is used to produce a thin film of $Bi_2Sr_2Ca_2Cu_3O_{10}$ oxide. In this third example, $SrTiO_3$ is used as the substrate 202. The environmental temperature T1 at the time of the first step and the environmental temperature at the time of the second stage are both 720° C. The quantity of the thin film of $Bi_2Sr_2CuO_6$ 302 grown in the first step is taken to be a 1-molecule thick layer. A layer containing calcium atoms in the same amount as the number of strontium atoms contained in the $Bi_2Sr_2CuO_6$ thin film 302 and copper atoms in a similar amount is accumulated to form the atom accumulation layer. The environmental temperature T3 at the time of the third step is 810° C. By repeating the process in the first through third steps above 20 times, a 20-molecule thick layer of a thin film of the oxide $Bi_2Sr_2Ca_2Cu_3O_{10}$ was produced. FIG. 6 is an x-ray of the thin film produced in this third example, demonstrating that $Bi_2Sr_2Ca_2Cu_3O_{10}$ was produced.

When the first through third steps above are repeated to accumulate layers of thin films of $Bi_2Sr_2Ca_nCu_{n+1}O_{6+2n}$ oxides as described above, it is possible to build up layers of thin films each having a different integer n as desired according to design. For example, after a 100-molecule $Bi_2Sr_2Ca_7Cu_8O_{20}$ with n=7 is accumulated and this is repeated to form a laminated structure. Since the thin film of the oxide $Bi_2Sr_2CaCu_2O_8$ with n=1 exhibits good superconductivity and the thin film of the oxide $Bi_2Sr_2Ca_7Cu_8O_{20}$ with n=7 is an insulator, when an electric current is passed through this laminated structure, the tunnel effect is exhibited, so this can be used as a tunnel device.

As described above, in this preferred embodiment of the present invention, upon a $Bi_2Sr_2CuO_6$ thin film 302 is accumulated a layer containing calcium atoms and copper atoms each in the amount of n/2 of the number of strontium atoms contained in this $Bi_2Sr_2CuO_6$ thin film 302, and these atoms are caused to react to grow a $Bi_2Sr_2Ca_nCu_{n+1}O_{6+2n}$ oxide thin film 304. Thus, it is possible to grow a $Bi_2Sr_2Ca_nCu_{n+1}O_{6+2n}$ oxide thin film 304 while preventing excess or deficiency of bismuth, which is one of its constituent elements. Therefore, there was nearly no generation of different phases or precipitation of impurities, so it was possible to obtain a high-quality $Bi_2Sr_2CaCu_2O_8$ oxide thin film 304.

In addition, if the amount of the $Bi_2Sr_2CuO_6$ thin film 302 formed in the first step is made to be 1 molecular layer, then only a small amount of reacting occurs in the third step so the time required for crystal growth can be reduced.

In addition, n was also set to values greater than 1, so it was possible to produce the $Bi_2Sr_2Ca_nCu_{n+1}O_{6+2n}$ oxide thin film 304 with various composition ratios, not only $Bi_2Sr_2CaCu_2O_8$ but also $Bi_2Sr_2Ca_2Cu_3O_{10}$, $Bi_2Sr_2Ca_3Cu_4O_{12}$ and the like as well, so it is possible to provide a wide range of superconducting materials.

In addition, in this preferred embodiment, the environmental temperature T3 at the time of the third step is set higher than the environmental temperature T1 at the time of the first step, so the reaction is advanced in the third step, thus shortening the time required for crystal growth.

In addition, this temperature setting also sets T1 lower than T3. In passing, in the first step, the fraction of the element bismuth incorporated into the $Bi_2Sr_2CuO_6$ thin film 302 has a tendency to become higher the lower the growth temperature (environmental temperature). Therefore, by setting a low growth temperature (environmental temperature) T1 in the first step, the fraction of bismuth incorporated into the thin film can be increased, so the time required for crystal growth from this point can be shortened.

The amount of the $Bi_2Sr_2CuO_6$ thin film 302 formed in the first step can be set to any appropriate amount, for example, a thick layer 5 molecules thick can be formed to increase the thickness of the thin film of $Bi_2Sr_2Ca_nCu_{n+1}O_{6+2n}$ oxide. Therefore, in the case of the oxides with n=1 to 4 that exhibit superconductivity, an even larger superconducting current can be carried so the scope of practical application can be expanded.

In addition, by repeating the first, second and third steps, layers of $Bi_2Sr_2Ca_nCu_{n+1}O_{6+2n}$ oxide thin film 304 are built up, so in the case of the oxides with n=1 to4 that exhibit superconductivity, an even larger superconducting current can be carried so the scope of practical application can be expanded in the same manner as in the case of increasing the thickness of the thin film as above.

Moreover, among the two or more layers of $Bi_2Sr_2Ca_nCu_{n+1}O_{6+2n}$ oxide thin film 304 built up, at least one layer has a different value of n than that of the other layers, so by changing this value of n, it is possible to build up alternating layers of superconductor and insulator, for example, so a laminated structure that exhibits the tunnel effect can be produced.

In the aforementioned explanation, molecular-beam epitaxy is adopted as the vapor-phase deposition method for growing the $Bi_2Sr_2Ca_nCu_{n+1}O_{6+2n}$ oxide thin film 304 according to the present invention, but other vapor-phase deposition methods may also be used, for example, laser ablation, sputtering or chemical vapor deposition (CVD).

To wit, in the case in which laser ablation is used to grow a thin film, a target of solid material is irradiated with laser light in a vacuum apparatus to induce the ablation of the raw material and the ejected particles are caused to accumulate upon a substrate to form a thin film. While the oxidation gas used in molecular-beam epitaxy is supplied, as the first step, the ratio of laser irradiation of the bismuth target is increased compared to that of targets of other materials in the case that separate targets of raw material elements are used, or the mixture ratio of bismuth is increased in the raw material mixture in the case that a target made of a mixture of raw materials is used, thereby growing a $Bi_2Sr_2CuO_6$ oxide thin film 302. As the second step, by using separate targets of calcium and copper or a mixed target of calcium and copper and irradiating these targets with laser light, a layer containing calcium atoms in the amount of n/2 of the number of strontium atoms contained in the $Bi_2Sr_2CuO_6$ thin film 302 and copper atoms in a similar amount is accumulated to form an atom accumulation layer 303 upon this $Bi_2Sr_2CuO_6$ thin film 302. As the third step, the $Bi_2Sr_2CuO_6$ thin film 302 and the calcium and copper atoms of the atom accumulation layer 303 are caused to react to form the $Bi_2Sr_2Ca_nCu_{n+1}O_{6+2n}$ oxide 304.

In addition, in the case in which sputtering is used to grow a thin film, ions or other particles with high kinetic energy hit a target of solid material in a vacuum apparatus, and the raw material sputtered off at the time of collision is caused to accumulate upon a substrate to form a thin film. While the oxidation gas as in the above is supplied, as the first step, the sputtering ratio of the bismuth target is increased compared to that of targets of other materials in the case that separate targets of raw material elements are used, or the mixture ratio of bismuth is increased in the raw material mixture in the case that a target made of a mixture of raw materials is used, thereby growing a $Bi_2Sr_2CuO_6$ oxide thin film 302. As the second step, by using separate targets of calcium and copper or a mixed target of calcium and copper and sputtering these targets, a layer containing calcium atoms in the amount of n/2 of the number of strontium atoms contained in the $Bi_2Sr_2CuO_6$ thin film 302 and copper atoms in a similar amount is accumulated to form an atom accumulation layer 303 upon this $Bi_2Sr_2CuO_6$ thin film 302. As the third step, the $Bi_2Sr_2CuO_6$ thin film 302 and the calcium and copper atoms of the atom accumulation layer 303 are caused to react to form the $Bi_2Sr_2Ca_nCu_{n+1}O_{6+2n}$ oxide 304.

Moreover, in the case in which CVD is used to grow a thin film upon a substrate through the chemical reactions of raw materials sent into a vacuum apparatus in the gaseous state, as the first step, the bismuth raw material is supplied into the vacuum apparatus for a longer time than that of the other materials, or the amount of bismuth raw materials supplied is made to be greater than that of the other raw materials, thereby growing a $Bi_2Sr_2CuO_6$ oxide thin film 302. As the second step, by supplying the raw materials for calcium and copper separately or simultaneously, a layer containing calcium atoms in the amount of n/2 of the number of strontium atoms contained in the $Bi_2Sr_2CuO_6$ thin film 302 and copper atoms in a similar amount is accumulated to form an atom accumulation layer 303 upon this $Bi_2Sr_2CuO_6$ thin film 302. As the third step, the $Bi_2Sr_2CuO_6$ thin film 302 and the calcium and copper atoms of the atom accumulation layer 303 are caused to react to form the $Bi_2Sr_2Ca_nCu_{n+1}O_{6+2n}$ oxide 304.

The present invention having the aforementioned composition can exhibit the meritorious effects described as follows.

First, according to the present invention, upon a $Bi_2Sr_2CuO_6$ oxide thin film is accumulated a layer containing calcium atoms and copper atoms each in the amount of n/2 of the number of strontium atoms contained in this $Bi_2Sr_2CuO_6$ oxide thin film, and these atoms are caused to react to grow a $Bi_2Sr_2Ca_nCu_{n+1}O_{6+2n}$ oxide thin film. Thus, it is possible to grow a $Bi_2Sr_2Ca_nCu_{n+1}O_{6+2n}$ oxide thin film while preventing excess or deficiency of bismuth, which is one of its constituent elements. Therefore, there is nearly no generation of different phases or precipitation of impurities, so it is possible to obtain a high-quality $Bi_2Sr_2CaCu_2O_8$ oxide thin film 304.

In addition, the environmental temperature at the time of the third step is set higher than the environmental temperature at the time of the first step, so the reaction is advanced in the third step, thus shortening the time required for crystal growth.

This temperature setting also sets the environmental temperature at the time of the first step lower than the environmental temperature at the time of the third step. In the first step, the fraction of the element bismuth incorporated into the $Bi_2Sr_2CuO_6$ oxide thin film has a tendency to become higher the lower the growth temperature. Therefore, by setting a low growth temperature in the first step, the fraction of bismuth incorporated into the thin film can be increased, so the time required for crystal growth from this point on can be shortened.

Moreover, the amount of the $Bi_2Sr_2CuO_6$ thin film formed in the first step can be set to any appropriate amount, for example, a thick layer 5 molecules thick or 8.7 molecules thick can be formed to increase the thickness of the thin film of $Bi_2Sr_2Ca_nCu_{n+1}O_{6+2n}$ oxide. Therefore, an even larger superconducting current can be carried so the scope of practical application can be expanded.

In addition, in the present invention, by repeating the first, second and third steps, layers of $Bi_2Sr_2Ca_nCu_{n+1}O_{6+2n}$ oxide thin film are built up, so an even larger superconducting current can be carried so the scope of practical application can be expanded in the same manner as in the case of increasing the thickness of the thin film as above.

Moreover, among the two or more layers of $Bi_2Sr_2Ca_nCu_{n+1}O_{6+2n}$ oxide thin film 304 built up, at least one layer has a different value of n than that of the other layers, so by changing this value of n, it is possible to build up alternating layers of superconductor and insulator, for example, so a laminated structure that exhibits the tunnel effect can be produced.

What is claimed is:

1. A crystal growth method for thin films of oxides wherein a vapor-phase deposition method is used to grow crystals for $Bi_2Sr_2Ca_nCu_{n+1}O_{6+2n}$ oxide thin film, where n is an integer equal to 1 or greater, comprising:

a first step of growing a $Bi_2Sr_2CuO_6$ multi-element oxide thin film to an arbitrary number of molecular layers by setting a growth environment to conditions in which oxides of bismuth alone are not formed, but said multi-element oxide is formed, and supplying said growth environment with an excess of bismuth compared with other elements, thereby preventing deficiency of bismuth and also evaporating excess bismuth from the thin film, a second step of causing a layer containing calcium atoms and copper atoms each in the amount of n/2 of the number of strontium atoms contained in said $Bi_2Sr_2CuO_6$ oxide thin film to accumulate upon said $Bi_2Sr_2CuO_6$ oxide thin film, and a third step of, in a state in which environmental temperature is set higher than the environmental temperature in the first step, causing said $Bi_2Sr_2CuO_6$ oxide thin film and the accumulated calcium atoms and copper atoms to react to grow crystals for a thin film of an oxide $Bi_2Sr_2Ca_nCu_{n+1}O_{6+2n}$, where n is an integer equal to 1 or greater.

2. The crystal growth method according to claim 1, wherein said first step, second step and third step are repeated to build up two or more layers of said thin film of the oxide $Bi_2Sr_2Ca_nCu_{n+1}O_{6+2n}$, where n is an integer equal to 1 or greater.

3. The crystal growth method according to claim 2, wherein among said two or more layers of the thin film of the oxide $Bi_2Sr_2Ca_nCu_{n+1}O_{6+2n}$ built up, at least one of the layers has a different value of n than the other layers.

4. The crystal growth method according to claim 1, wherein said vapor-phase deposition method is molecular-beam epitaxy.

5. The crystal growth method according to claim 1, wherein said vapor-phase deposition method is laser ablation.

6. The crystal growth method according to claim 1, wherein said vapor-phase deposition method is sputtering.

7. The crystal growth method according to claim 1, wherein said vapor-phase deposition method is chemical vapor deposition.

8. The crystal growth method according to claim 2, wherein said vapor-phase deposition method is molecular-beam epitaxy.

9. The crystal growth method according to claim 2, wherein said vapor-phase deposition method is laser ablation.

10. The crystal growth method according to claim 2, wherein said vapor-phase deposition method is sputtering.

11. The crystal growth method according to claim 2, wherein said vapor-phase deposition method is chemical vapor deposition.

12. The crystal growth method according to claim 3, wherein said vapor-phase deposition method is molecular-beam epitaxy.

13. The crystal growth method according to claim 3, wherein said vapor-phase deposition method is laser ablation.

14. The crystal growth method according to claim 3, wherein said vapor-phase deposition method is sputtering.

15. The crystal growth method according to claim 3, wherein said vapor-phase deposition method is chemical vapor deposition.

* * * * *

UNITED STATES PATENT AND TRADEMARK OFFICE
CERTIFICATE OF CORRECTION

PATENT NO.    : 6,183,552 B1
DATED         : February 6, 2001
INVENTOR(S)   : Shigeki Sakai, et al.

It is certified that error appears in the above-identified patent and that said Letters Patent is hereby corrected as shown below:

Title page,
Item [73], the Assignee's information is incorrectly listed.
Item [73] should read as follows:

[73]    Assignee: Agency of Industrial Science & Technology, Ministry of International Trade & Industry, Tokyo (JP)

Signed and Sealed this

Twenty-eighth Day of August, 2001

*Attest:*

NICHOLAS P. GODICI
*Attesting Officer*    Acting Director of the United States Patent and Trademark Office